United States Patent [19]

Choi

[11] Patent Number: 5,446,285
[45] Date of Patent: Aug. 29, 1995

[54] HUMAN BODY SENSING DEVICE AND METHOD FOR FABRICATING THE SAME

[75] Inventor: Jun R. Choi, Seoul, Rep. of Korea

[73] Assignee: Goldstar Co., Ltd., Seoul, Rep. of Korea

[21] Appl. No.: 170,776

[22] Filed: Dec. 21, 1993

[30] Foreign Application Priority Data

Dec. 24, 1992 [KR] Rep. of Korea ............... 25469/1992

[51] Int. Cl.⁶ .................... H01L 27/144; G01J 5/10
[52] U.S. Cl. ................ 250/338.2; 250/338.3; 250/DIG. 1
[58] Field of Search ............ 250/DIG. 1, 338.2, 338.3

[56] References Cited

U.S. PATENT DOCUMENTS

| | | | |
|---|---|---|---|
| 4,926,051 | 5/1990 | Turnbull | 250/332 |
| 5,107,120 | 4/1992 | Tom | 250/342 |
| 5,126,718 | 6/1992 | Doctor | 340/567 |

FOREIGN PATENT DOCUMENTS

| | | | |
|---|---|---|---|
| 62-63825 | 3/1987 | Japan | 250/338.2 |
| 64-13423 | 1/1989 | Japan | |

*Primary Examiner*—Constantine Hannaher

[57] ABSTRACT

A human body sensing device capable of sensing not only the presence of the human body, but, also the human body's position. The device includes a lens unit, for dividing a room to be monitored into a plurality of lateral and vertical zones and projecting an infrared ray emitted from an object present in one of the zones, a filter unit, for filtering only an infrared ray emitted from the human body from infrared rays received from the lens unit, and an infrared sensor unit for sensing the human body's position, based on the infrared ray received from the filter unit.

12 Claims, 4 Drawing Sheets

HUMAN BODY SENSING DEVICE AND METHOD FOR FABRICATING THE SAME

BACKGROUND OF THE INVENTION

1. Field of the Invention

The present invention relates to a human body sensing device using an infrared sensor, and more particularly to a human body sensing device for sensing an infrared ray emitted from the human body and sensing the human body's position, based on the sensed infrared ray and a method for fabricating the same.

2. Description of the Prior Art

Generally, HgCdTe infrared sensors being commonly used have a high sensitivity and few errors. By virtue of such characteristics, they are employed in artificial satellites and for the military purpose of watching the movements of the enemy. The infrared sensors are also used for checking defects of machinery and realizing thermal images by measuring a temperature distribution without contact.

On the other hand, pyro-electric infrared sensors being mainly used as unit devices exhibit a small wavelength dependency as compared to the HgCdTe infrared image sensors. They can operate at a room temperature and are very economical. By such characteristics, they are employed for crime prevention and in automatic doors to determine the presence of the human body.

In spite of the above-mentioned advantages, the ultra-electrical type infrared sensors have been used only for limited purposes. This is because the ultra-electrical type infrared sensors have a sensitivity lower than 1/10 of that of the HgCdTe infrared image sensors. As a result, the ultra-electrical type infrared sensors could not be used for military purposes requiring high accuracy.

Referring to FIG. 1, there is illustrated an infrared sensor employed in a human body sensor of a general type. As shown in FIG. 1, the human body sensor comprises a manganese oxide (MgO) substrate 1 and a dielectric film 2 formed by depositing a ferroelectric thin film such as PbTiO$_3$ over the MgO substrate 1 by use of a sputtering process and then partially etching the ferroelectric thin film to obtain a patterned structure.

At both lateral ends of the dielectric film 2, support members 3 made of polyimide are disposed on the MgO substrate 1. An upper electrode 4 made of a material having a high conductivity such as Au is disposed on the dielectric film 2.

A lower electrode 5 is disposed on a surface of the MgO substrate 1 opposite to the surface on which the dielectric film 2 and the prior art upper electrode 4 are disposed. The lower electrode 5 is formed by anisotropically etching the surface of the MgO substrate 1 opposite to the surface including the dielectric film 2 and the upper electrode 4 by use of a wet etching process so as to leave the dielectric film 2 supported by the polyimide support members 3 and then depositing nickel-chromium alloy over a region where the dielectric film 2 remains.

In other words, the human body sensing device comprises the polyimide layer 3 formed on the upper surface of the MgO substrate 1, the dielectric film 2 interposed between the MgO substrate 1 and the polyimide layer 3, an upper electrode 4 formed on both the dielectric film 2 and the polyimide layer 3, and the lower electrode 5 formed on the lower surface of the MgO substrate 1.

When an infrared ray is applied to the infrared sensor having the above-mentioned structure, it is absorbed by the lower electrode 5 and converted into a heat by which an electric charge difference occurs between both surfaces of the dielectric film 2. As a result, a potential difference occurs between the upper electrode 4 and the lower electrode 5.

This potential difference between the upper electrode 4 and the lower electrode 5 is then converted into a capacitor voltage which is, in turn, amplified. The amplified capacitor voltage is treated to be converted into an image.

As mentioned above, however, the infrared sensing device has a degradation in performance in that a dielectric material having a high sensitivity is not be readily available, that even though a high-sensitive dielectric material is available, it is irregularly deposited, and that an error is generated due to a thermal interference among sensors.

SUMMARY OF THE INVENTION

Therefore, an object of the invention is to provide a human body sensing device capable of sensing not only the presence of the human body, but also the human body's position by forming an oxide film between adjacent infrared sensors so as to prevent a lateral thermal loss of the infrared sensors, subjecting the back surface of a silicon substrate to an anisotropic etching process so as to prevent a longitudinal thermal loss, and providing Fresnel lenses corresponding in number to the infrared sensors so as to project an image onto the infrared sensors, and a method for fabricating the same.

In accordance with the present invention, this object can be accomplished by providing a human body sensing device comprising: a lens unit for dividing a room to be monitored into a plurality of lateral and vertical zones and projecting infrared rays emitted from an object present in one of said zones; a filter unit for filtering only infrared rays emitted from the human body from infrared rays received from said lens unit; and an infrared sensor unit for sensing the human body's position, based on the infrared rays received from said filter unit.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
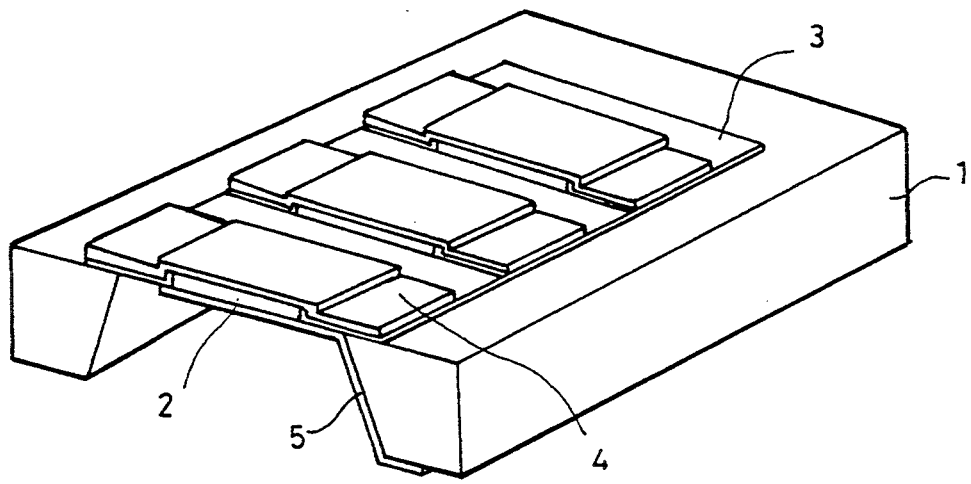
FIG. 1 is a perspective view illustrating an infrared sensor structure of a conventional human sensing device.
Figure 2:
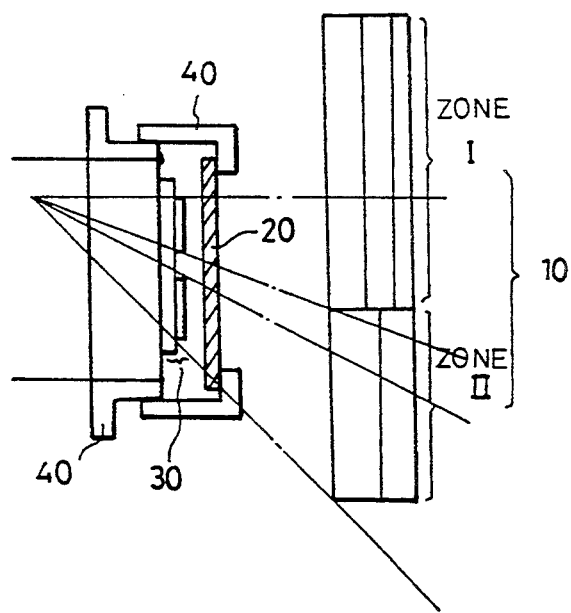
FIG. 2 is an elevation view of a human body sensing device in accordance with the present invention, showing a state that infrared rays are projected onto infrared sensors of the human body sensing device fin the longitudinal axis direction.

Referring to FIG. 2, there is illustrated a human body sensing device in accordance with the present invention. As shown in FIG. 2, the human body sensing device comprises a lens unit 10 for dividing a room into lateral zones 1 to 5 in the lateral direction and into vertical zones A and B in the vertical direction and projecting an infrared rays emitted from an object present in one of the zones. The human body sensing device further comprises a filter unit 20 for filtering an infrared rays of wavelengths emitted from the human body from infrared rays fed from the tens unit 10, and an infrared sensor unit 30 for sensing the human body's position, based on the sensed human body's infrared ray.

The filter unit 20 adapted to filter the infrared rays of wavelengths emitted from the human body is fixedly disposed above the infrared sensor unit 30 by means of a package 40 to be stably spaced from the infrared sensor unit 30. The lens unit 10, adapted to project wavelengths received from the outside onto the infrared sensor unit 30, has a cylindrical shape and is fixedly disposed to focus the received wavelengths onto the back surface of the infrared sensor unit 30. On the other hand, the infrared sensor unit 30 is packed in the package 40.

The lens unit 10 is constituted by a plurality of Fresnel lenses corresponding in number to the zones divided from a room. The infrared sensor unit 30 is constituted by a plurality of infrared sensors corresponding in number to the Fresnel lenses.

Figure 3A:
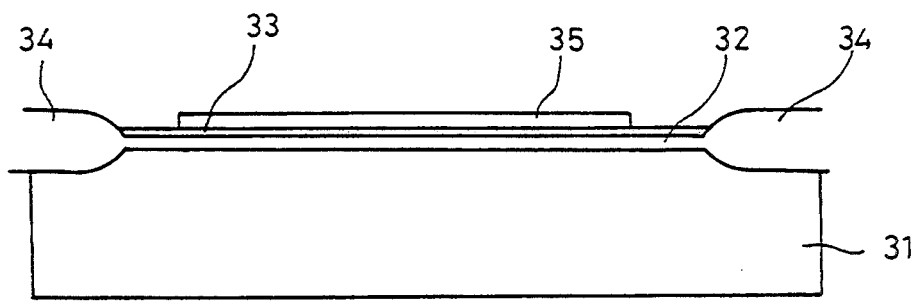
FIGS. 3A to 3C are sectional views respectively illustrating a method for fabricating the infrared sensors of the human body sensing device in accordance with the present invention.
Figure 3B:
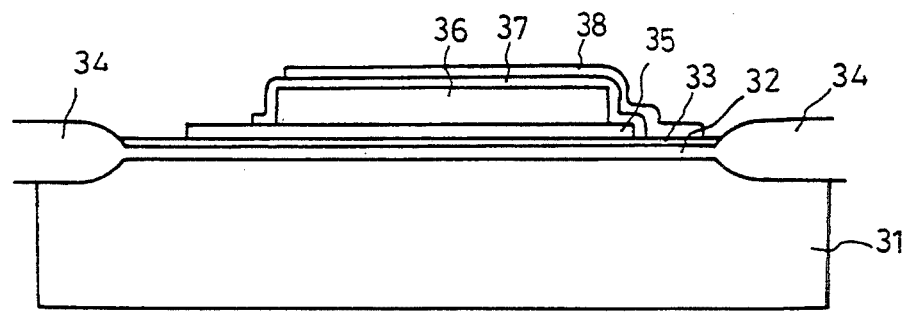
Figure 3C:
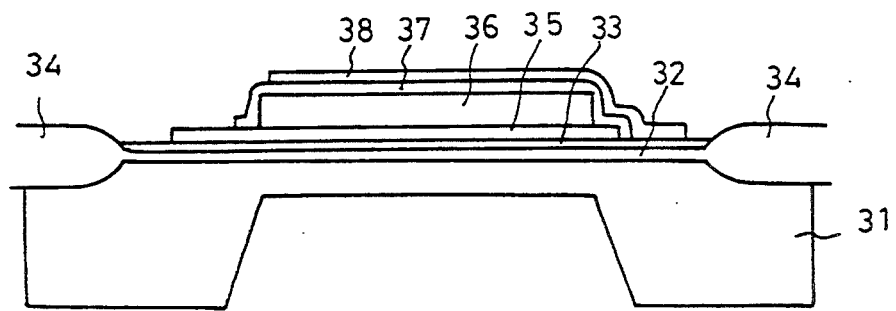

The infrared sensor of the infrared sensor unit 30 is fabricated in accordance with the method illustrated in FIGS. 3A to 3C.

In accordance with the method, a substrate 31 is prepared which is obtained by heavily doping an impurity such as boron in a clean and well-dried silicon body. An oxide film 32 made of $SiO_2$ is then grown to a predetermined thickness over the substrate 31, as shown in FIG. 3A. On the first oxide film 32, an insulating film 33 is then formed by selectively depositing a silicon nitride ($Si_3N_4$) film over the first oxide film 32.

Thereafter, second oxide films 34 for isolating adjacent infrared sensors are grown on the substrate 31 at both ends of the insulating film 33 by use of a local oxidation of silicon (LOCOS) process using an oxidation mask, On the insulating film 33, titanium-platinum (Ti-Pt) alloy is deposited by use of a sputtering process. The titanium-platinum alloy layer is then selectively etched to form a lower electrode 35.

Subsequently, a ferroelectric material such as PbLaTiO is deposited over the lower electrode 35 and then patterned by a selective etching process to form a dielectric film 36, as shown in FIG. 3B. Over the structure including the dielectric film 36, the lower electrode 35 and the insulating film 33, a third oxide -Film 37 is deposited. A nickel-chromium (Ni-Cr) alloy is then deposited over the third oxide film 37 to form an upper electrode 38.

As shown in FIG. 3C, the substrate 1 is then subjected to an anisotropic etching at its portion extending from the back surface to the impurity-doped surface.

In other words, each infrared sensor has a structure including the substrate 31, the first film 32 and insulating film 33 both formed on the substrate 31, the lower electrode 35 and dielectric film 36 both formed on the insulating film 33, and the third oxide film 37 and upper electrode 38 both formed on the dielectric film 36.

Figure 4A:
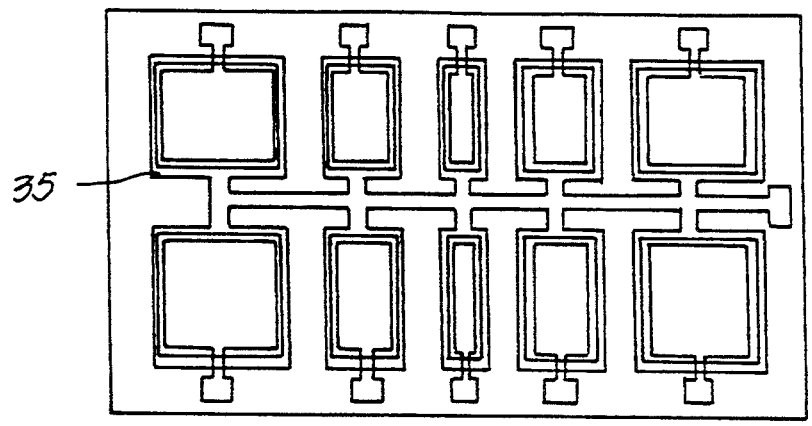
FIGS. 4A and 4B are a plan view, and a sectional view respectively, illustrating the infrared sensors of the human body sensing device in accordance with the present invention.
Figure 4B:
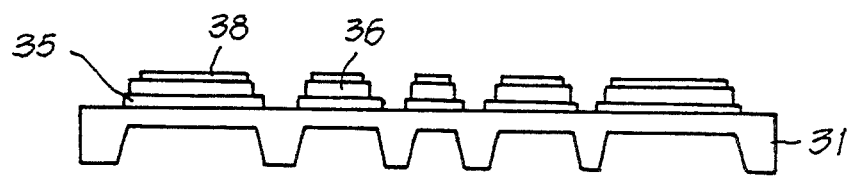

The infrared sensors fabricated by the above-mentioned method are arranged such that they correspond to the zones divided from the room, respectively, as shown in FIGS. 4A and 4B.

Operation of the human body sensing device having the above-mentioned construction in accordance with the present invention will now be described in conjunction with FIGS. 2 to 6.

The following description will be made in conjunction with a case where a room to be monitored is divided into 10 zones including a combination of lateral zones 1 to 5 and vertical zones A and B so as to sense the position of a human body present in the room. The human body sensing device includes 10 infrared sensors and 10 Fresnel's lenses corresponding in number to the number of zones.

Figure 5:
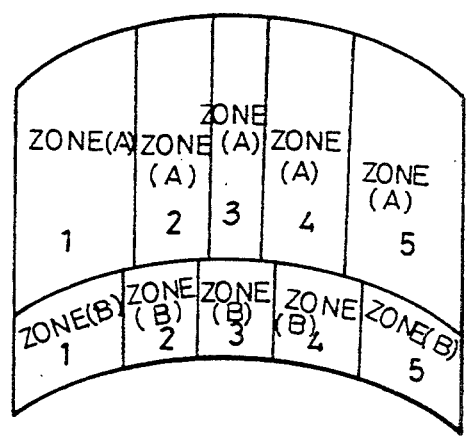
FIG. 5 is a schematic view illustrating respective infrared ray projecting zones of the infrared sensors in accordance with the present invention.
Figure 6:
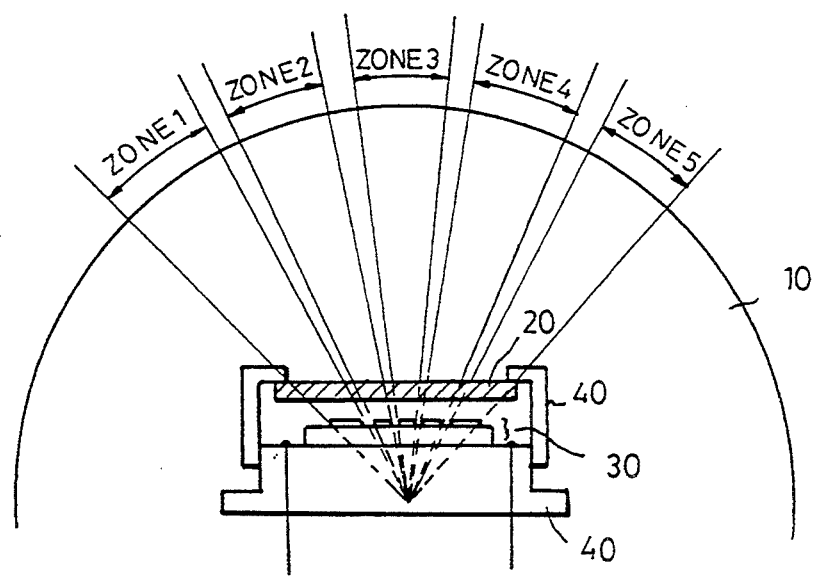
FIG. 6 is a schematic view illustrating a state that infrared rays are projected onto the infrared sensors of the present invention in the transverse axis direction.

The room is divided into lateral zones 1 to 5 in the lateral direction and into vertical zones A and B in the vertical direction, as shown in FIG. 5. Where the room is divided to have more zones, the human body's position can be more accurately sensed. In such a case, however, the signal processing operation is more complex.

Where a person is present in one of the zones into which the room is, the infrared rays emitted from the human body are applied to the lens unit 10 in the transverse axis direction and the longitudinal axis direction in accordance with in FIGS. 2 and 6.

At this time, the infrared rays from the human body are concentrated on the selected infrared sensor of the infrared sensor unit 30 because the Fresnel lenses are made of polyimide material and the infrared sensors and the Fresnel lenses are arranged such that they correspond to the zones of the room. The concentrated infrared rays are then applied to the filter unit 20.

In the filter unit 20, only a infrared rays having the wavelength of 7 to 9 $\mu$m (corresponding to a range of infrared rays emitted from the human body) are transmitted. Infrared rays emitted from a lamp installed in the room are not transmitted through the filter unit 20. The infrared rays passing through the filter unit 20 are then fed to the upper electrode 38 of the infrared sensor of infrared sensor unit 30.

The infrared rays are then converted into a heat by the upper electrode 38. The heat is transferred to the dielectric film 36 via the third oxide film 37. The dielectric film 36 senses the transferred heat, so that an electric charge difference occurs between both surfaces of the dielectric film 36. At this time, the third oxide film 37 serves to prevent a current leakage due to the electric charge difference.

By the electric charge difference, a potential difference occurs between the upper electrode 38 and the lower electrode 35. This potential difference is amplified and then converted into an image. Thus, the position of the human body's position can be sensed.

By the second oxide film 34, the heat absorbed by the dielectric film 36 is prevented form being lost in the transverse direction. Since the dielectric film 36 is obtained by a patterning achieved by an anisotropic etching process to which the substrate 31 is subjected, a longitudinal heat loss is prevented. As a result, the total heat loss can be minimized. By the prevention of heat loss, the sensitivity of the infrared sensor unit can be enhanced.

As apparent from the above description, the present invention provides a human body sensing device including infrared sensors corresponding to zones divided from a room to be monitored, and thereby capable of accurately sensing a human body's position. In fabrication of the infrared sensors, an oxide film is formed which prevents head loss in the transverse direction. The back surface of a substrate constituting a part of each infrared sensor is also subjected to a patterning using an anisotropic etching process, thereby enabling a heat loss in the longitudinal axis direction to be prevented. As a result, the efficiency of the infrared sensing device can be improved so as to sense not only the presence of he human body, but also the human body's position.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A human body sensing device comprising:
   a lens unit for dividing a room to be monitored into a plurality of lateral and vertical zones and projecting infrared rays emitted within said zones;
   a filter unit for transmitting infrared rays emitted from a living human being in one or more of said zones and blocking rays emitted at other wavelengths;
   an infrared sensor unit for sensing the living human being's position, based on the infrared rays received from said filter unit;
   wherein said infrared sensor unit comprises a substrate, a first oxide film formed on said substrate in first regions forming a two-dimensional array, a first insulating film formed on the oxide film in said first regions, a lower electrode formed on said first insulating film in said first regions, a dielectric film formed on the insulating film in said first regions, and an upper electrode formed on said dielectric film in said first regions.

2. The device in accordance with claim 1, wherein said lens unit comprises a plurality of cylindrical Fresnel lenses.

3. The device in accordance with claim 1, wherein said lens unit is arranged such that i% has a focus on the back surface of said infrared sensor unit.

4. The device in accordance with claim 1, wherein said infrared sensor unit further comprises another oxide film interposed between said dielectric film and said upper electrode and adapted to prevent a current leakage due to an electric charge difference.

5. The device in accordance with claim 1, wherein said infrared sensor unit further comprises another oxide film formed in second regions lying between said first regions, and adapted to prevent heat flow between said first regions.

6. The device of claim 5, wherein said oxide film formed in said second regions is thicker than said first oxide film in the first regions.

7. The device of claim 1, wherein said filter unit transmits wavelengths in the range from 7 to 9 microns.

8. A human body sensing device comprising:
   a substrate;
   an infrared array sensor formed on said substrate for sensing a position of a human body in a space, wherein said infrared array sensor comprises a plurality of unit sensors each of which senses incident infrared beams emitted from said space, respectively;
   a cylindrical Fresnel lens for dividing said space into a plurality of zones and focusing the infrared beams emitted from each of said plurality of zones into each of said plurality of unit sensors, respectively, wherein the number of said zones equals the number of said unit sensors.;
   a filter for filtering only an infrared beam emitted from the human body from a beam focused by said cylindrical Fresnel lens; and
   a plurality of insulating films which are formed between each of said unit sensors for preventing heat loss and interference.

9. A human body sensing device in accordance with claim 8, said infrared sensor having a plurality of unit sensors each of which comprises;
   first insulating film formed on said substrate, a second insulating film formed on said first insulating film, a lower electrode formed on said second insulating film, a dielectric film formed on said lower electrode, a third insulating film formed on said dielectric film, an upper electrode formed on said third insulating film and wherein a back surface of said substrate is anisotropically etched.

10. A human body sensing device in accordance with claim 9, wherein said first and second insulating films are of silicon oxide.

11. A human body sensing device in accordance with claim 8, wherein said insulating films are of silicon oxide.

12. A human body sensing device in accordance with claim 8, wherein said substrate is silicon heavily doped by boron.

* * * * *